US011460895B2

(12) United States Patent
Hobbs et al.

(10) Patent No.: US 11,460,895 B2
(45) Date of Patent: Oct. 4, 2022

(54) THERMAL MODULE ASSEMBLY FOR A COMPUTING EXPANSION CARD PORT OF AN INFORMATION HANDLING SYSTEM

(71) Applicant: Dell Products L.P., Round Rock, TX (US)

(72) Inventors: Derric Christopher Hobbs, Round Rock, TX (US); Christopher M. Helberg, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 21 days.

(21) Appl. No.: 17/023,900

(22) Filed: Sep. 17, 2020

(65) Prior Publication Data
US 2022/0083108 A1 Mar. 17, 2022

(51) Int. Cl.
G06F 1/18 (2006.01)
H05K 7/20 (2006.01)
H05K 5/02 (2006.01)

(52) U.S. Cl.
CPC ............. *G06F 1/185* (2013.01); *G06F 1/186* (2013.01); *H05K 5/026* (2013.01); *H05K 7/2039* (2013.01)

(58) Field of Classification Search
CPC ......... G06F 1/185; G06F 1/186; H05K 5/026; H05K 7/2039
See application file for complete search history.

(56) References Cited

U.S. PATENT DOCUMENTS

| 5,473,511 | A | * | 12/1995 | Reddy | H05K 7/20409 |
| | | | | | 165/80.3 |
| 5,943,208 | A | * | 8/1999 | Kato | G11B 33/08 |
| | | | | | 361/679.31 |
| 6,266,250 | B1 | * | 7/2001 | Foye | H02B 1/043 |
| | | | | | 211/41.17 |
| 6,377,455 | B1 | * | 4/2002 | Nelik | G06F 1/184 |
| | | | | | 165/185 |
| 7,145,773 | B2 | * | 12/2006 | Shearman | H05K 7/1461 |
| | | | | | 361/715 |
| 7,262,958 | B2 | * | 8/2007 | Marroquin | G06F 1/187 |
| | | | | | 312/223.2 |
| 7,920,383 | B2 | * | 4/2011 | Yang | H01L 23/3675 |
| | | | | | 361/704 |
| 8,289,712 | B2 | * | 10/2012 | Holahan | H05K 7/20472 |
| | | | | | 361/710 |
| 10,394,291 | B2 | * | 8/2019 | Kho | H05K 7/1402 |
| 10,653,037 | B2 | * | 5/2020 | Hoffmeyer | H01L 23/3737 |
| 10,827,629 | B2 | * | 11/2020 | Neuman | H05K 1/0271 |
| 10,966,345 | B2 | * | 3/2021 | Chen | H05K 7/20409 |
| 11,079,560 | B2 | * | 8/2021 | Leigh | G02B 6/4269 |
| 11,195,779 | B2 | * | 12/2021 | Brown | H01L 23/4006 |

(Continued)

*Primary Examiner* — Adrian S Wilson
(74) *Attorney, Agent, or Firm* — Baker Botts, L.L.P.

(57) ABSTRACT

A thermal module assembly, comprising: a computing expansion card; a thermal interface material (TIM) positioned on a surface of the computing expansion card; a thermal plate; and a carrier configured to hold the computing expansion card with the TIM positioned on the surface of the computing expansion card, the carrier include a first end positioned opposite to a second end, wherein the thermal plate is removably coupled to the carrier at the first end and the second end to provide an uniform pressure between the thermal plate, the TIM material, and the computing expansion card.

16 Claims, 14 Drawing Sheets

(56) References Cited

U.S. PATENT DOCUMENTS

| | | | |
|---|---|---|---|
| 2005/0190540 A1* | 9/2005 | Shearman | H05K 7/1461 361/715 |
| 2008/0239651 A1* | 10/2008 | Curnalia | G11B 33/122 361/679.34 |
| 2011/0012255 A1* | 1/2011 | Suganuma | H01L 23/433 257/712 |
| 2012/0162919 A1* | 6/2012 | Lin | H01L 23/3675 361/704 |
| 2014/0170898 A1* | 6/2014 | Elison | H05K 7/20454 439/487 |
| 2015/0234437 A1* | 8/2015 | Gallina | G06F 1/185 361/679.32 |
| 2016/0360645 A1* | 12/2016 | Achard | H01L 23/367 |
| 2018/0054915 A1* | 2/2018 | Achard | H01L 23/367 |
| 2018/0321715 A1* | 11/2018 | Gopalakrishna | G06F 1/187 |
| 2018/0332735 A1* | 11/2018 | Wei | H05K 7/20418 |

* cited by examiner

THERMAL MODULE ASSEMBLY FOR A COMPUTING EXPANSION CARD PORT OF AN INFORMATION HANDLING SYSTEM

BACKGROUND

Field of the Disclosure

The disclosure relates generally to information handling systems, and specifically, a thermal module assembly for a computing expansion card port for information handling systems.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems can include computing expansion cards (e.g. M.2 solid state devices). As technology develops, the computing expansion cards can increase in power and computing resources, necessitating thermal solutions to ensure optimal performance at maximum speeds.

SUMMARY

Innovative aspects of the subject matter described in this specification may be embodied in a thermal module assembly, comprising a computing expansion card; a thermal interface material (TIM) positioned on a surface of the computing expansion card; a thermal plate; and a carrier configured to hold the computing expansion card with the TIM positioned on the surface of the computing expansion card, the carrier include a first end positioned opposite to a second end, wherein the thermal plate is removably coupled to the carrier at the first end and the second end to provide an uniform pressure between the thermal plate, the TIM material, and the computing expansion card.

These and other embodiments may each optionally include one or more of the following features. For instance, the carrier includes a first side positioned opposite to a second side, with a support bar structure positioned between the first side and the second side at the first end of the carrier. The first side includes a first member extending between the first end and the second end of the carrier, and the second side includes a second member extending between the first end and the second end of the carrier. The support bar structure including a first protruding member and a second protruding member that protrude over the first member and the second member, respectively. A first end of the thermal plate, when coupled to the carrier, is positioned between the first protruding member and the first member, and between the second protruding member and the second member. The carrier further includes a landing at the second end of the carrier, wherein a second end of the thermal plate, opposite to the first end of the thermal plate, is removably coupled to the landing by a fastener. The first side includes a first platform and the second side includes a second platform, the first and the second platforms holding the computing expansion card. The second end of the carrier includes a third platform connected between the first and the second platforms, the third platform holding the computing expansion card. The first end of the carrier further includes an opening positioned between the first side and the second side.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
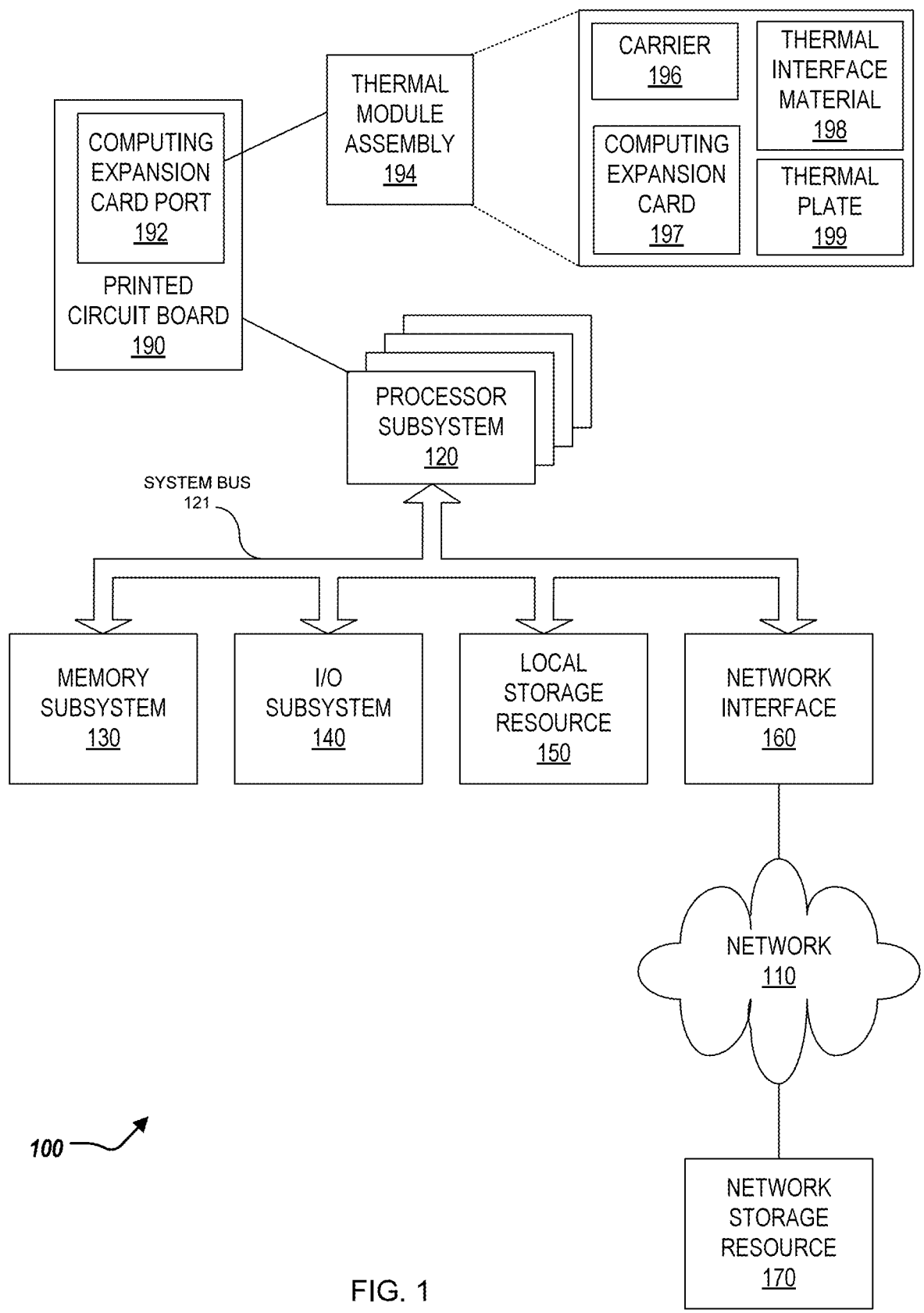
FIG. 1 illustrates a block diagram of selected elements of an embodiment of an information handling system.

This disclosure discusses a thermal module assembly including a carrier, a computing expansion card, a thermal interface material, and a thermal plate. The thermal module assembly can be coupled with a printed circuit board to provide improve thermal performance at the computing expansion card (e.g., removing heat from the computing expansion card). The thermal interface material can provide a conduction path from the computing expansion card to the thermal plate. The thermal plate in combination with the thermal interface material can provide cooling to the computing expansion card (removal of heat from the computing expansion card). The thermal module assembly can provide uniform (or substantially uniform) pressure between the computing expansion card, the thermal interface material, and the thermal plate to improve the thermal performance at the computing expansion card.

Specifically, this disclosure discusses a computing expansion card; a thermal interface material (TIM) positioned on a surface of the computing expansion card; a thermal plate; and a carrier configured to hold the computing expansion card with the TIM positioned on the surface of the computing expansion card, the carrier include a first end positioned opposite to a second end, wherein the thermal plate is removably coupled to the carrier at the first end and the second end to provide an uniform pressure between the thermal plate, the TIM material, and the computing expansion card.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-9 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. In some examples, components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. In some examples, the information handling system 100 may be independent of including the processor subsystem 120. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

The information handling system 100 can further include a printed circuit board (PCB) 190 such as a motherboard. The PCB 190 can include multiple computing components, or is coupled to multiple computing components, such as processors, memory, and similar. The PCB 190 can include a computing expansion card port 192. The computing expansion card port 192 can provide an interface between the information handling system 100, and in particular the PCB 190, and computing expansion cards.

In particular, the computing expansion card port 192 can be coupled with, or in communication with, a thermal module assembly 194. The thermal module assembly 194 can include a carrier 196 that is configured to "hold" a computing expansion card 197, a thermal interface material (TIM) 198, and a thermal plate 199, all described further herein. The thermal module assembly 194 can be coupled to the computing expansion card port 192.

In short, the carrier 196 is able to couple each of the computing expansion card 197, the TIM 198, and the thermal plate 199 together, and subsequent couple to the computing expansion card port 192. The TIM 198 (e.g., a thermal pad) can create a conduction path from the computing expansion card 197 (e.g., serving as a source of heat) to the thermal plate 199. The thermal plate 199 in combination with the TIM 198 can increase cooling (temperature reduction) of the computing expansion card 197.

The thermal module assembly 194 can facilitate providing uniform (or consistent) pressure between the computing expansion card 197, the TIM 198, and the thermal plate 199 for enhanced thermal performance of the computing expansion card 197, described further herein.

Figure 2A:
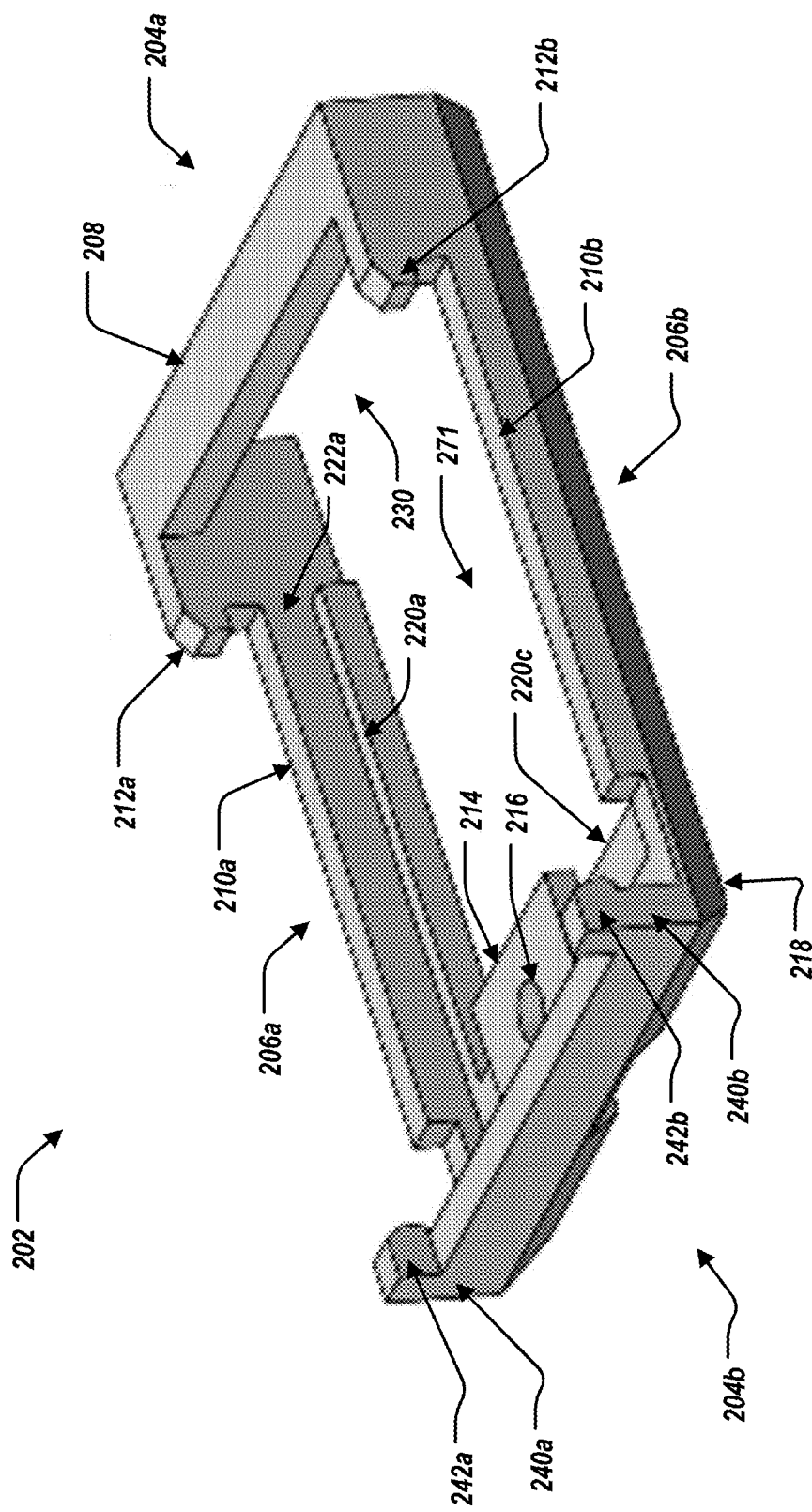
FIGS. 2A, 2B illustrate perspective views of a carrier of a thermal module assembly.
Figure 2B:
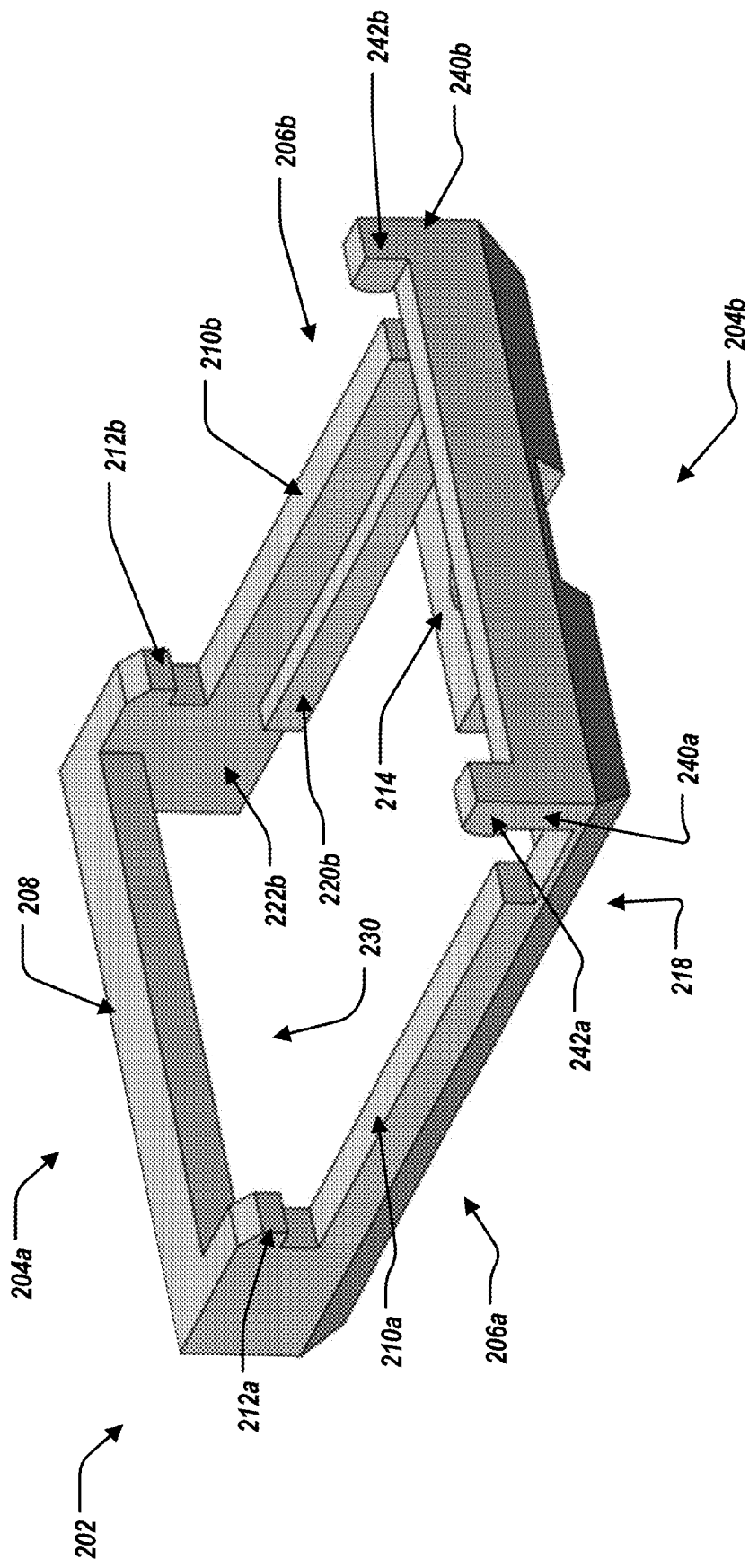

FIGS. 2A, 2B illustrates a carrier 202, similar to the carrier 196 of FIG. 1. The carrier 202 can include a first end 204a positioned opposite to a second end 204b. The carrier 202 can further include a first side 206a positioned opposite to a second side 206b. The carrier 202 can include a support bar structure 208 positioned between the first side 206a and the second side 206b at the first end 204a of the carrier 202.

The first side 206a of the carrier 202 can further include a first member 210a extending between the first end 204a and the second end 204b. The second side 206b of the carrier 202 can further include a second member 210b extending between the first end 204a and the second end 204b. The first member 210a and the second member 210b are collectively referred to as members 210.

The support bar structure 208 can include a first protruding member 212a that protrudes over the first member 210a. That is, the first protruding member 212a extends from the support bar structure 208 away from the first side 206a and towards the second side 206b, and is in superimposition with at least a portion of the first member 210a. Additionally, the support bar structure 208 can include a second protruding member 212b that protrudes over the second member 210b. That is, the second protruding member 212b extends from the support bar structure 208 away from the first side 206a and towards the second side 206b, and is in superimposition with at least a portion of the second member 210b. The first protruding member 212a and the second protruding member 212b are collectively referred to as protruding members 212.

The carrier 202 can further include a landing 214 at the second end 204b. The landing 214 can include an egress 216 that extends through the landing 214 and to a bottom side 218 of the carrier 202.

The first side 206a of the carrier 202 can include a first platform 220a. The first platform 220a can extend along an inside wall 222a of the first side 206a generally from the first end 204a to the second end 204b. Additionally, the second side 206b of the carrier 202 can include a second platform 220b. The second platform 220b can extend along an inside wall 222b of the second side 206b generally from the first end 204a to the second end 204b.

The second end 204b of the carrier 202 can include a third platform 220c. The third platform 220c can extend between the first side 206a and the second side 206b. The third platform 220 is connected between the first platform 220a and the second platform 220b. The platforms 220a, 220b, 220c are collectively referred to as platforms 220.

The first end 204a of the carrier 202 can further include an opening 230 positioned between the first side 206a, the second side 206b, and the support bar structure 208.

The second end 204b of the carrier can further include a first post 240a positioned on the first side 206a. The first post 240a can include a first protrusion 242a extending towards the first end 204a of the carrier 202. Additionally, the second end 204b of the carrier can further include a second post 240b positioned on the second side 206b. The second post 240b can include a second protrusion 242b extending towards the first end 204a of the carrier 202. The first post 240a and the second post 240b can collectively be referred to as posts 240.

The carrier 202 can further include an opening 271 positioned between the first side 206a, the second side 206b, the first end 204a and the second end 204b.

FIGS. 3A-3E illustrate a thermal module assembly 300, similar to the thermal module assembly 194 of FIG. 1. The thermal module assembly 300 can include the carrier 202, a computing expansion card 304, a thermal interface material (TIM) 306, and a thermal plate 308; similar to the carrier 196, the computing expansion card 197, the TIM 198, and the thermal plate 199, respectively, of FIG. 1.

The computing expansion card 304 can include a M.2 expansion card (Next Generation Form Factor (NGFF) expansion card). The computing expansion card 304 can include a top surface 310 positioned opposite to a bottom surface 373. In some examples, the computing expansion card 304 can further include a first flange 312a, a second flange 312b, a third flange 312c, and a fourth flange 312d (collectively referred to as flanges 312). The flanges 312 surround a perimeter of the computing expansion card 304. In some examples, the flanges 312 can be separate and distinct from each other. In some examples, two or more of the flanges 312 can be connected. In some examples, each of the flanges 312 are connected about the perimeter of the computing expansion card 304. In some examples, the computing expansion card 304 can include a subset of the flanges 312. In some examples, the computing expansion card 304 can include other configurations. In some examples, the computing expansion card 304 does not include (is independent of) flanges 312.

The computing expansion card 304 can further include a top front surface 314a, and a bottom front surface 314b surrounding the fourth flange 312d. The fourth flange 312d can include a cutout 315. In some examples, the cutout 315 can be semi-circular.

The thermal plate 308 can include a first end 320a positioned opposite to a second end 320b. The second end 320b of the thermal plate 308 can include an egress 322. The thermal plate 308 can further include edge portions 321a and 321b (collectively referred to as edge portions 321).

Figure 3A:
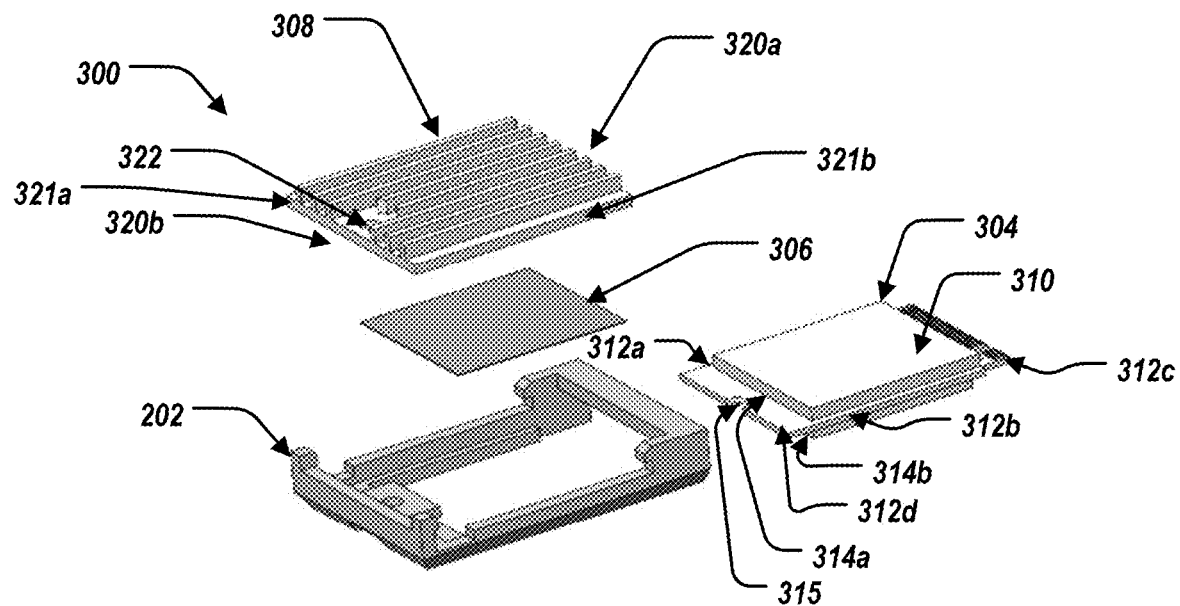
FIGS. 3A-3E illustrate assembly of the thermal module assembly.
Figure 3B:
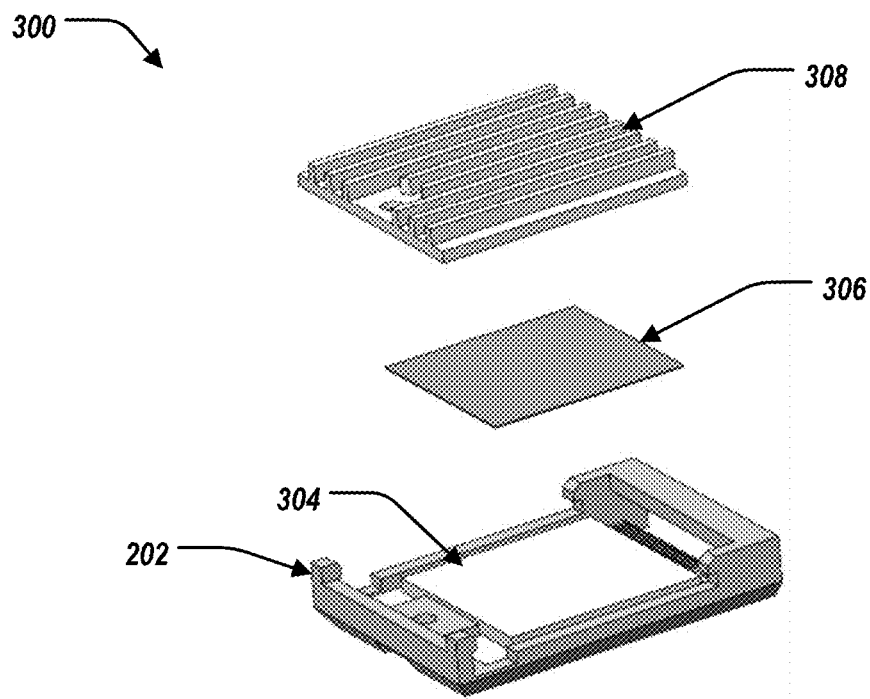

Referring to FIG. 3B, the computing expansion card 304 can be positioned through (slid) through the opening 230 of the carrier 202. In some examples, the computing expansion card 304 can be positioned through the opening 271 of the carrier 202. The computing expansion card 304 can be positioned on the carrier 202 such that the flanges 312 of the computing expansion card 304 are in contact with the platforms 220. That is, the platforms 220 are holding the computing expansion card 304. The first flange 312a can be in contact with the first platform 220a, the second flange 312b can be in contact with the second platform 220b, and the fourth flange 312d can be in contact with the third platform 220c. Furthermore, the fourth flange 312d can be positioned between the third platform 220c and the landing 214 such that the cutout 315 is in superimposition with the egress 216 of the carrier 202. Additionally, in some examples, the top front surface 314a may abut the landing 214.

In some examples, when the computing expansion card 304 does not include the flanges 312, the computing expansion card 304 can be positioned on the carrier 202 such that the bottom surface 373 of the computing expansion card 304 is in contact with the platforms 220. That is, the platforms 220 are holding the bottom surface 373 of the computing expansion card 304.

Figure 3C:
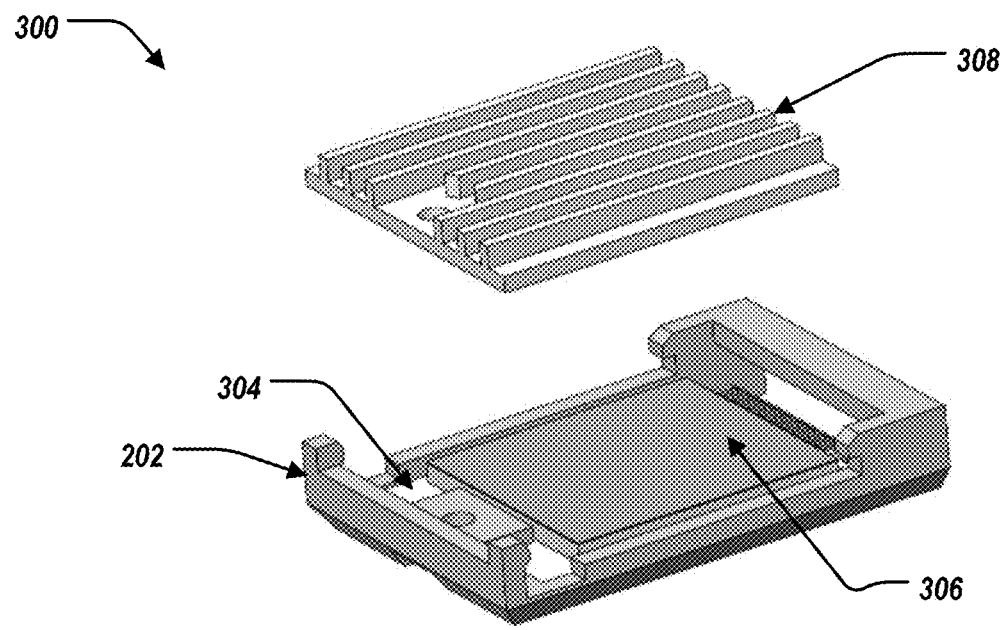

Referring to FIG. 3C, the TIM 306 is positioned on the top surface 310 of the computing expansion card 304. Thus, the carrier 202 is holding the computing expansion card 304 with the TIM 306 positioned on the top surface 310 of the computing expansion card 304. In some examples, an adhesive is positioned between the top surface 310 of the computing expansion card 304 and the TIM 306 to facilitate positioning the TIM 306 on the computing expansion card 304.

Figure 3D:
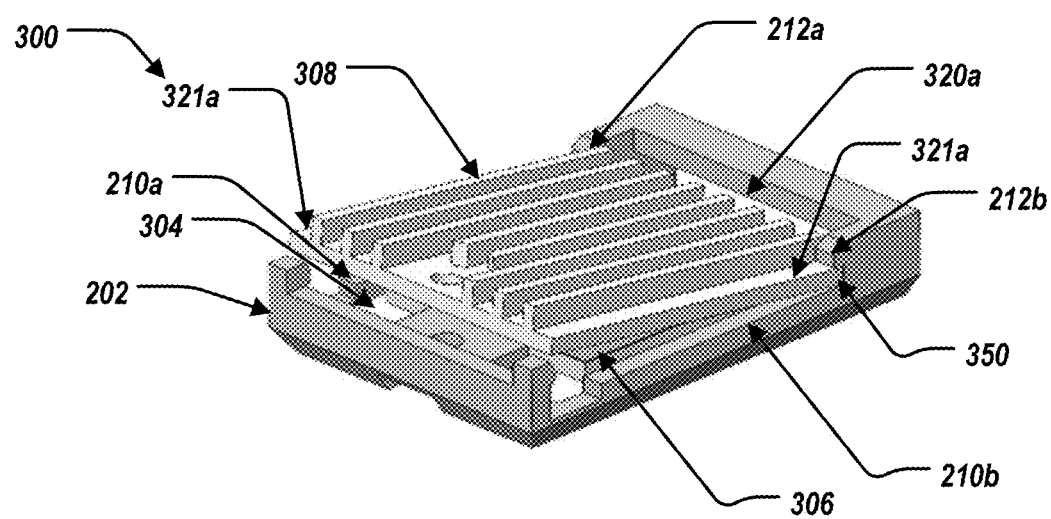

Referring to FIG. 3D, the first end 320a of the thermal plate 308 is positioned between the protruding members 212 and the members 210. Specifically, the edge portions 321 at the first end 320a of the thermal plate 308 can be positioned between the protruding members 212 and the members 210.

Figure 3E:
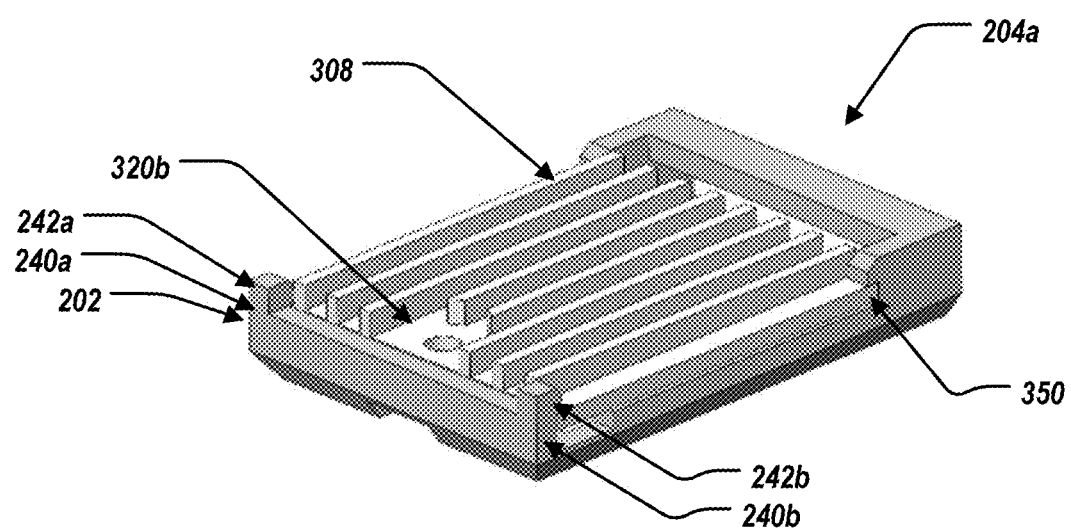

Referring to FIG. 3E, the thermal plate 308 is rotated at the first end 204a of the carrier 202 such that the second end 320b of the thermal plate 308 is adjacent to the landing 214 of the carrier 202. Specifically, the thermal plate 308 is rotated about a pivot point 350 such that the second end 320b of the thermal plate 308 becomes positioned on the landing 214 of the carrier 202. As the thermal plate 308 is rotated about the pivot point 350, the second end 320b of the thermal plate 308 can engage the posts 240. Specifically, the second end 320b of the thermal plate 308 can engage the posts 240 such that the posts 240 flex away from the thermal plate 308—e.g., away from the first end 204a of the carrier 202. The posts 240 can flex an amount to allow the second end 320b of the thermal plate 308 to overcome the protrusions 242 such that the edge portions 321 at the second end 320b of the thermal plate 308 are positioned between the protrusions 242 and the bottom side 218 of the carrier 202. As a result, the thermal plate 308 is securely coupled to the carrier 202 by be positioning between the protruding member 212 and the members 210, and between the protrusions 242 and the bottom side 218 of the carrier 202. Moreover, by securely coupling the thermal plate 308 with the carrier 202, the computing expansion card 304 including the TIM 306 is securely coupled to the carrier 202 via the thermal plate 308.

In some examples, the thermal plate 308, after positioning the edge portions 321 at the second end 320b of the thermal plate 308 between the protrusions 242 and the bottom side 218 of the carrier 202, can be coupled to the carrier 202 using a fastener. Specifically, the egress 322 of the thermal plate 308, the cutout 315 of the computing expansion card 304, and the egress 216 of the carrier 202 can be placed in superimposition when the thermal plate 308 is coupled to the carrier 202. A fastener can be positioned through the egress 322, the cutout 315, and the egress 216 to couple the carrier 202 with the thermal plate 308 and the computing expansion card 304 to the printed circuit board 190, described further herein.

In some examples, the thermal plate 308 is coupled to the carrier 202 (the first end 320a of the thermal plate is coupled to the first end 204a of the carrier 202, and the second end 320b of the thermal plate 308 is coupled to the second end 204b of the carrier 202) to provide an uniform (or substantially uniform) pressure between the thermal plate 308, the TIM 306, and the computing expansion card 304. That is, uniform pressure (or substantially uniform) pressure is applied at the top surface 310 of the computing expansion card 306 between the thermal plate 308, the TIM 306, and the computing expansion card 304 when the thermal plate 308 is coupled to the carrier 202. In particular, the thermal plate 308 is able to apply uniform (or substantially uniform) pressure between the thermal plate 308 and the TIM 306 that is positioned on the top surface 310 of the computing expansion card 304 when the thermal plate 308 is coupled to the carrier 202 to provide increased thermal performance of the computing expansion card 304 (or at the computing expansion card 304). That is, when the thermal plate 308 is coupled to the carrier 202, the thermal plate 308 is able to provide consistent pressure (or substantially consistent pressure) to the TIM 306 and the computing expansion card 304 to increase thermal performance at the computing expansion card 304 (e.g., removing heat from the computing expansion card 304).

Moreover, when the computing expansion card 304 is positioned within the carrier 202, and the thermal plate 308 is coupled to the carrier 202, the opening 230 (positioned between the first side 206a, the second side 206b, and the support bar structure 208) additionally facilitates thermal performance at the computing expansion card 306. Specifically, air within the environment proximate to the thermal module assembly 300 is able to move (or flow) across the thermal plate 308 and through the opening 230, improving the thermal performance at the computing expansion card 304 (e.g., removing heat from the computing expansion card 304).

Figure 4A:
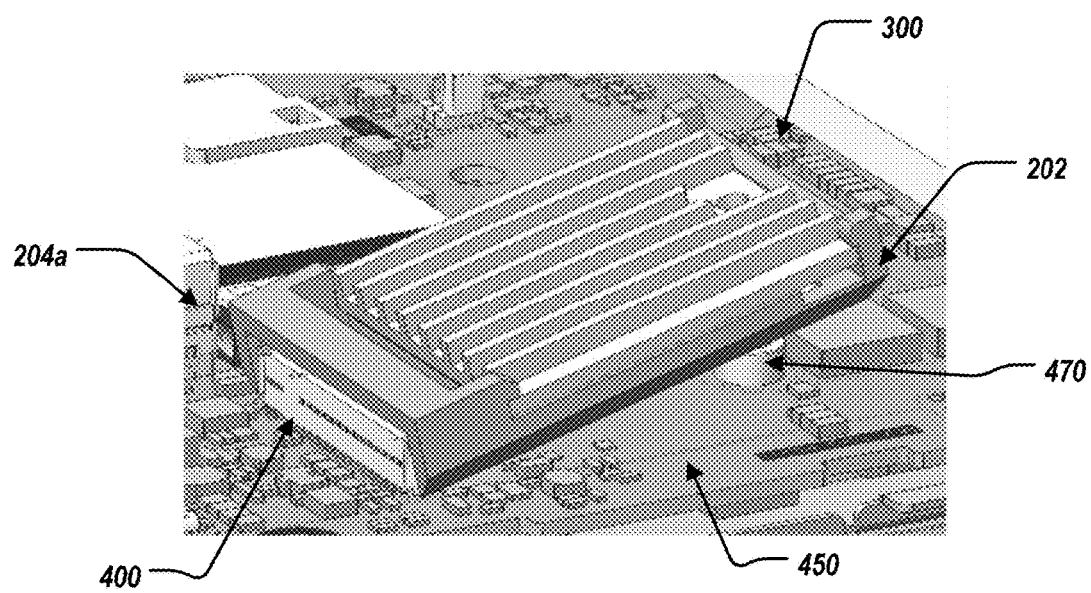
FIGS. 4A, 4B illustrate coupling of the thermal module assembly to a printed circuit board of the information handling system.

Referring to FIG. 4A, the thermal module assembly 300 is coupled to a computing expansion card port 400 of a printed circuit board (PCB) 450. The computing expansion card port 400 can be similar to the computing expansion card port 192 of FIG. 1; and the PCB 450 can be similar to the printed circuit board 190 of FIG. 1. The thermal module assembly 300 can be coupled to the computing expansion card port 400 through an interface (mechanical interface) of the computing expansion card 304 and the computing expansion card port 400. The thermal module assembly 300 can be coupled to the computing expansion card port 400 at the first end 204a of the carrier 202. The PCB 450 can further include a standoff 470.

Figure 4B:
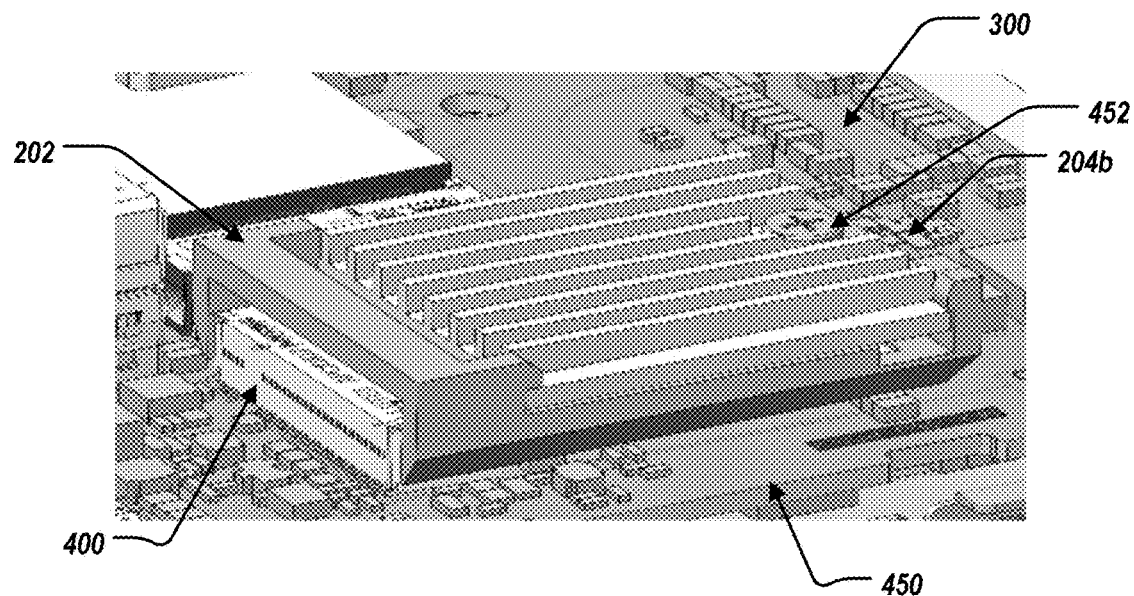

Referring to FIG. 4B, the thermal module assembly 300 can be coupled to the PCB 450. The thermal module assembly 300 can be coupled to the PCB 450 with a fastener 452. Specifically, the fastener 452 can be positioned through the egress 322 of the thermal plate 308, the cutout 315 of the computing expansion card 304, and the egress 216 of the carrier 202 to couple the thermal module assembly 300 to the standoff 470 of the PCB 450. The thermal module assembly 300 can be coupled to the PCB 450 at the second 204b of the carrier 202.

The thermal module assembly 300, when coupled to the PCB 450, and in particular, the computing expansion card port 400, maintains a position between the assembly 300 and the port 400 to facilitate electrical alignment between the computing expansion card 304 and the computing expansion card port 400. That is the thermal module assembly 300 facilitates a proper electrical coupling between the computing expansion card 304 and the computing expansion card port 400 when the thermal module assembly 300 is coupled to the PCB 450, as described further herein.

To that end, coupling the thermal module assembly 300 to the standoff 470 of the PCB 450 with the fastener 452 can facilitate applying uniform (or substantially uniform) pressure between the thermal plate 308 and the TIM 306 that is positioned on the top surface 310 of the computing expansion card 304 when the thermal plate 308 is coupled to the carrier 202. By coupling the thermal module assembly 300 to the standoff 470 of the PCB 450 with the fastener 452, increased thermal performance of the computing expansion card 304 (e.g., removing heat from the computing expansion card 304) is provided. In some examples, the standoff 470 is a conductive coupling device such that when the thermal module assembly 300 is coupled to the standoff 470 of the PCB 450 with the fastener 452, the standoff 470 provides a consistent chassis ground for the computing expansion card 304.

Figure 5:
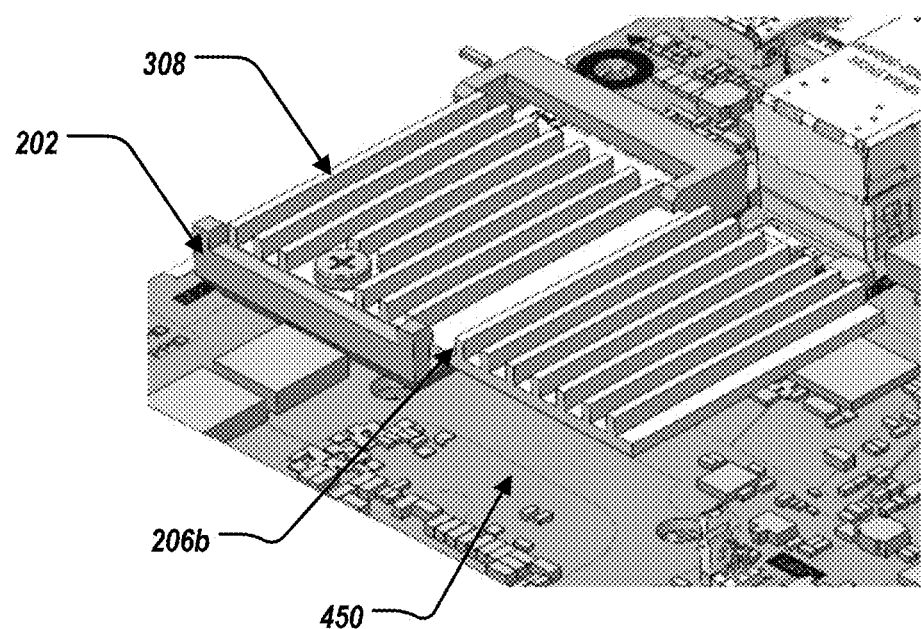
FIGS. 5-7 illustrates the thermal module assembly, in further implementations.
Figure 6:
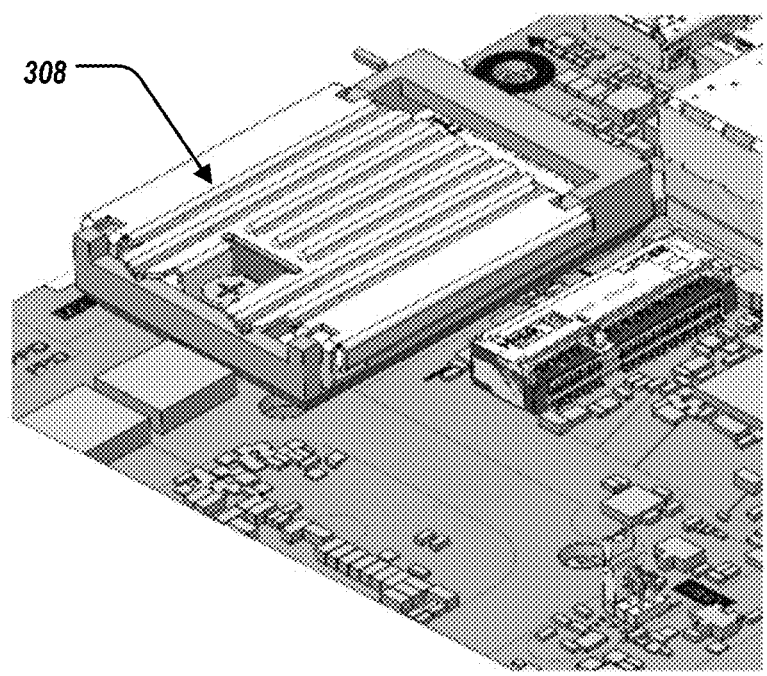

In some examples, the thermal plate 308 can have different shapes and different types. As shown in FIG. 5, the thermal plate 308 can extend beyond the carrier 202. As illustrated, the thermal plate 308 can extend laterally past the carrier 202 at the second side 206b. For example, a portion of the thermal plate 308 can be directly positioned over the PCB 450. In some examples, by extending the thermal plate 308 beyond the carrier 202, increased thermal performance of the computing expansion card 304 is provided. Moreover, be extending the thermal plate 308 over the PCB 450, the thermal plate 308 can additionally facilitate providing heat sinking to other components positioned on the PCB 450 in superimposition to the thermal plate 308. As shown in FIG. 6, the thermal plate 308 can include a sheet metal material.

Figure 7:
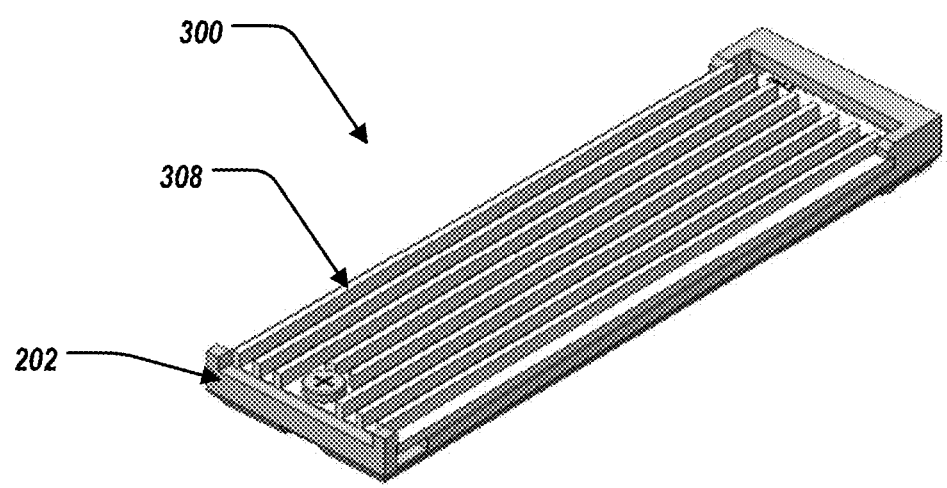

As shown in FIG. 7, the thermal module assembly 300 can be of differing sizes to accommodate differently sized computing expansion cards 306 (e.g., 2230, 2280, etc.). As a result, the thermal plate 308 can be increased in size to accommodate the increase in size of the computing expansion card 304. In some examples, the computing expansion card 304 is single-sided, or double-sided.

Figure 8A:
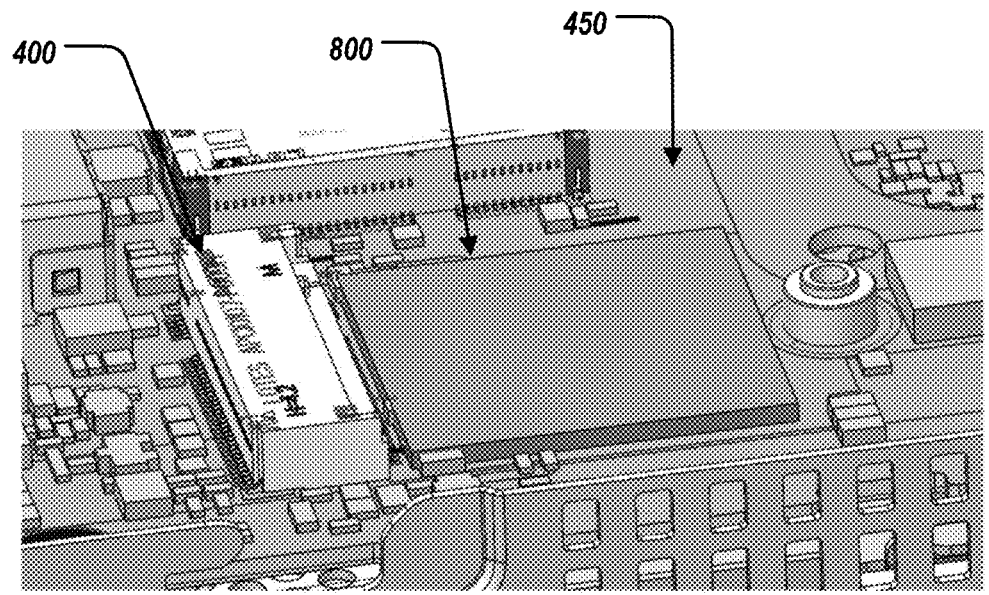
FIGS. 8A-8C illustrate the thermal module assembly with an underlaying thermal pad.
Figure 8B:
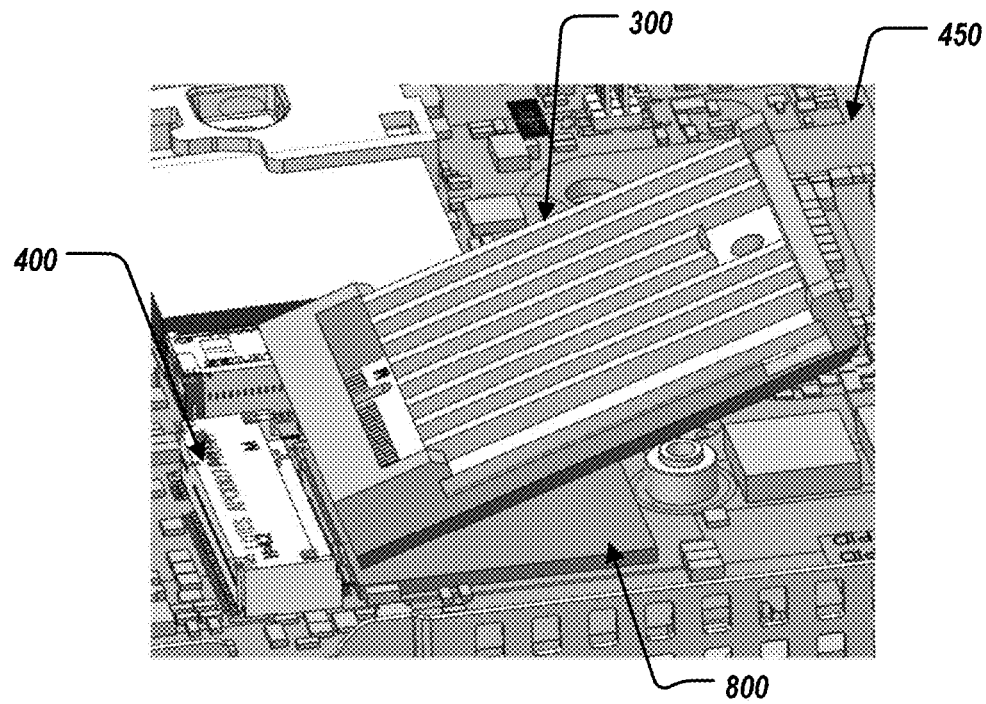
Figure 8C:
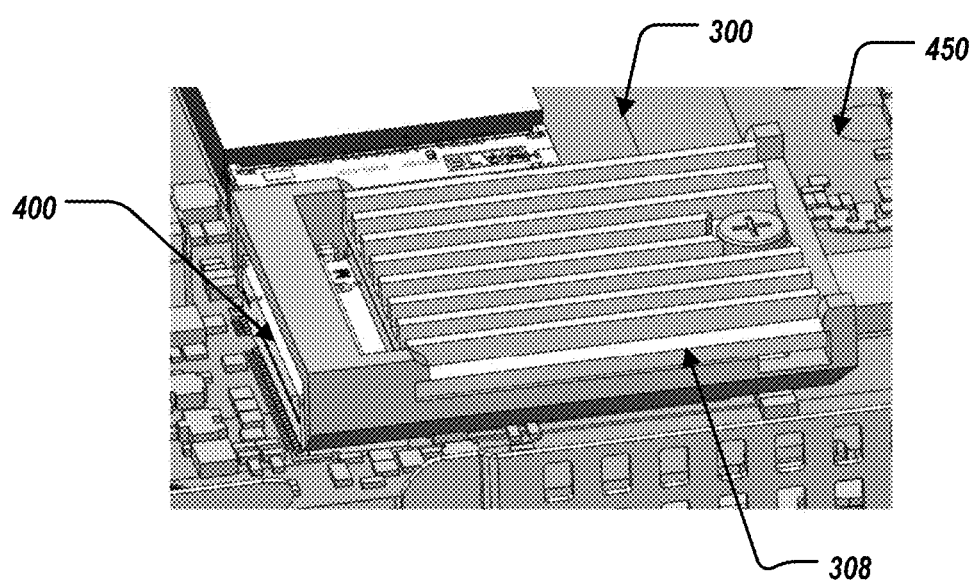

In some examples, the thermal module assembly 300 can be coupled to the PCB 450 with a previously coupled thermal pad. Referring to FIG. 8A, the PCB 450 is shown including a thermal pad 800 proximate to the computing expansion card port 400. The thermal pad 800 can provide additional heat sinking to the computing expansion card 304 when the thermal module assembly 300 is coupled to the PCB 450. For example, as shown in FIGS. 8B and 8C, the thermal module assembly 300 is coupled to a computing expansion card port 400. The thermal pad 800 is positioned between the PCB 450 and the thermal module assembly 300. Thus, the thermal pad 800 and the thermal plate 308 can provide increased thermal performance at the computing expansion card 304 (e.g., removing heat from the computing expansion card 304).

In some examples, the carrier 202 and/or the thermal plate 308 can include hooking features that can interlock with openings of the PCB 450 for additional coupling between the thermal module assembly 300 and the PCB 450.

Figure 10A:
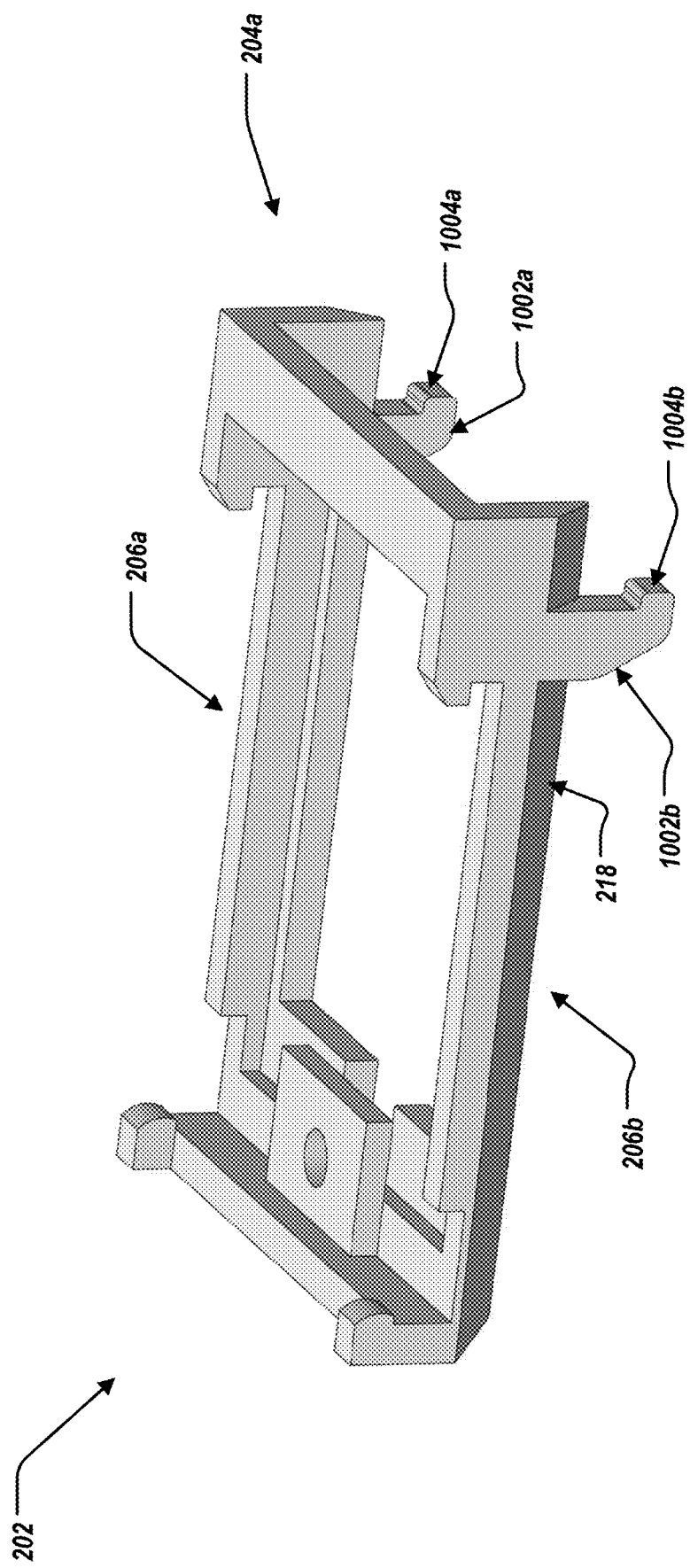
FIG. 10A illustrates the thermal module assembly, in a further implementation.
Figure 10B:
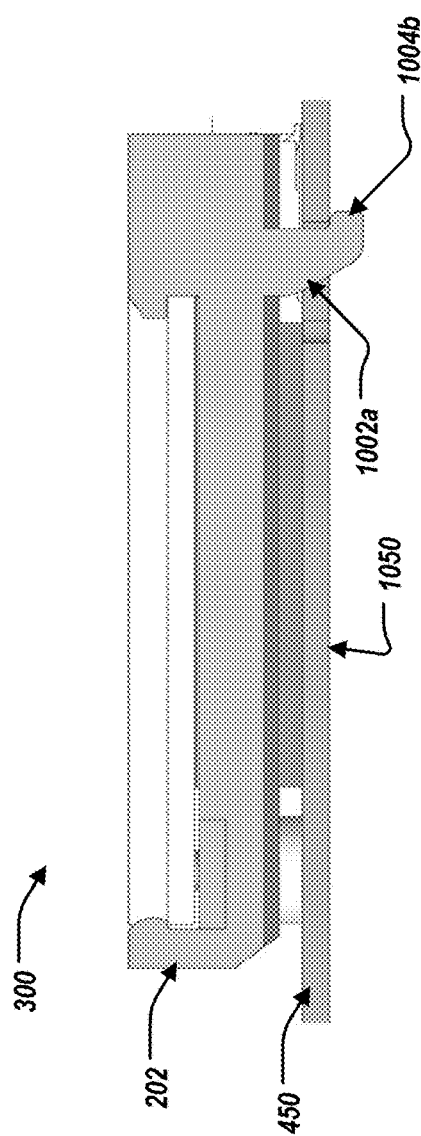
FIGS. 10B, 10C illustrate coupling of the thermal module assembly to the printed circuit board of the information handling system, in a further implementation
Figure 10C:
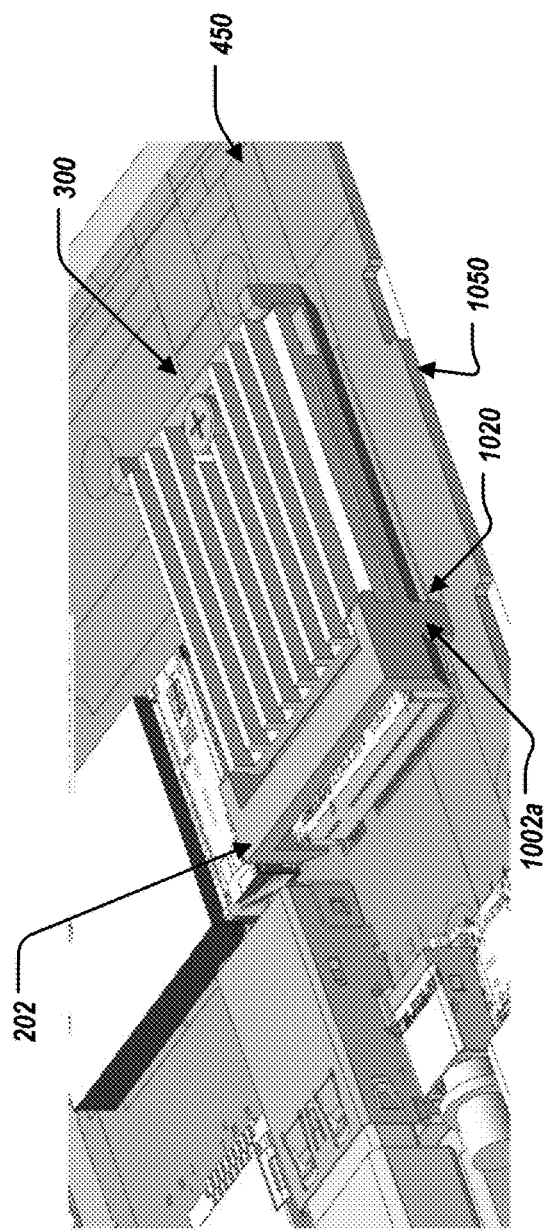

Specifically, FIG. 10A illustrates the carrier 202 including a first hooking feature 1002a and a second hooking feature 1002b (collectively referred to as hooking features). The first hooking feature 1002a can be positioned proximate to the first end 204a and the first side 206a of the carrier 202 and protrude from the bottom side 218 of the carrier 202. The first hooking feature 1002a can include a protrusion 1004a that extends towards the first end 204a. Similarly, the second hooking feature 1002b can be positioned proximate to the first end 204a and the second side 206b of the carrier 202 and protrude from the bottom side 218 of the carrier 202. The second hooking feature 1002b can include a protrusion 1004b that extends towards the first end 204a. As show in FIGS. 10B, 10C, the thermal module assembly 300 can be coupled to the PCB 450. Specifically, the hooking features 1002 of the carrier 202 engage the PCB 450 through openings 1020 of the PCB 450 such that at least the protrusions 1004a, 1004b of the carrier 202 are positioned through the openings 1020 and engage a bottom side 1050 of the PCB 450 for additional coupling between the thermal module assembly 300 and the PCB 450.

Figure 9:
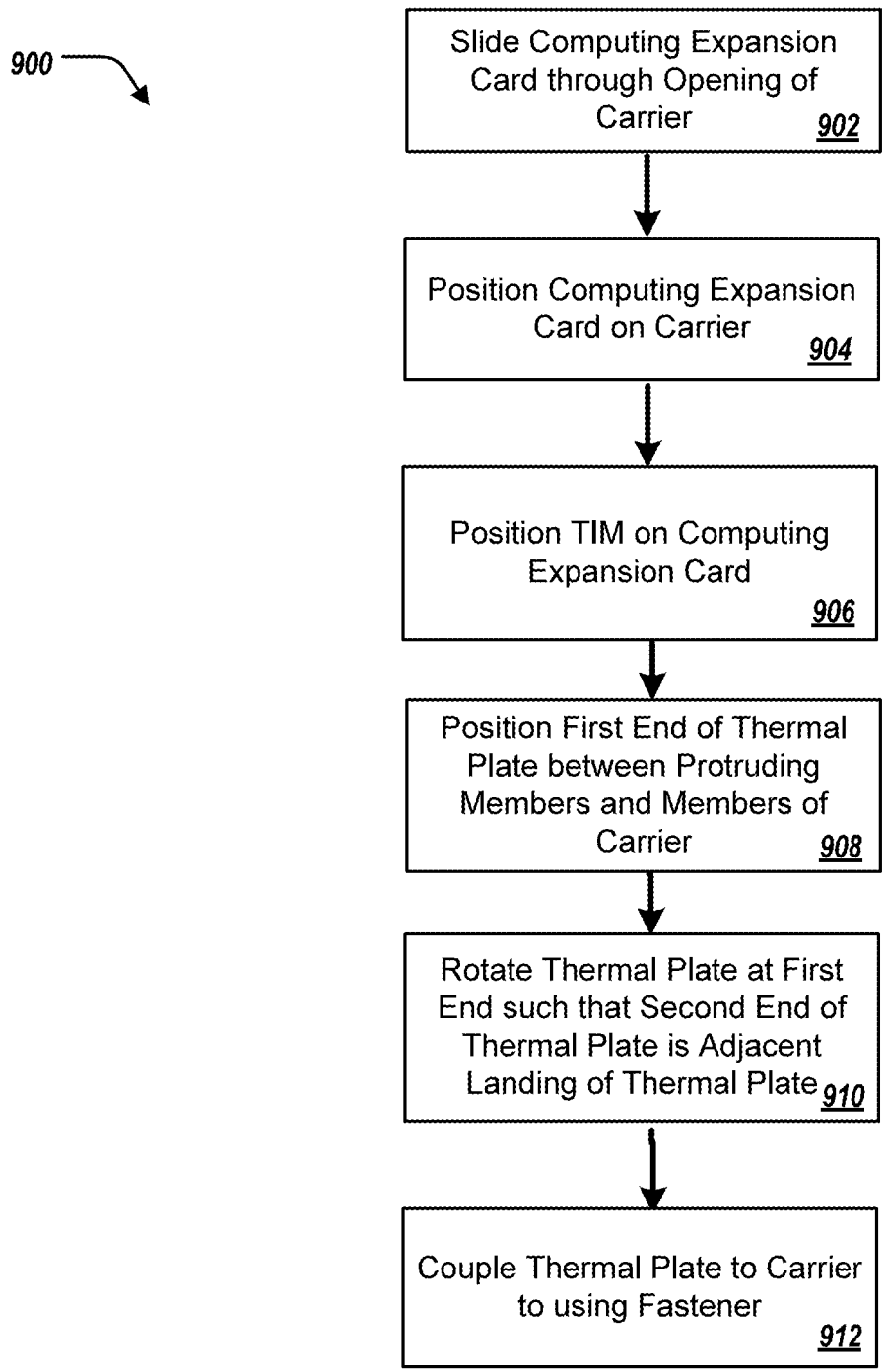
FIG. 9 illustrates a flowchart illustrating a method of coupling a computing expansion card to a carrier of the thermal module assembly.

FIG. 9 illustrates a flowchart depicting selected elements of an embodiment of a method 900 for coupling the computing expansion card 304 to the carrier 202, with reference to FIGS. 1-8 and 10. It is noted that certain operations described in method 900 may be optional or may be rearranged in different embodiments.

The computing expansion card 304 is slid through the opening 230 of the first end 204a of the carrier 202 (902). The computing expansion card 304 is positioned on the carrier 202 such that the computing expansion card 304 is in contact with the platform 220 of the carrier 202 (904). The TIM 306 is positioned on the top surface 310 of the computing expansion card 304 (906). In some examples, the TIM 306 is positioned on the top surface 310 of the computing card 304 after the computing expansion card 304 is positioned on the carrier 202. In some examples, the TIM 306 is positioned on the top surface 310 of the computing card before the computing expansion card 304 is positioned on the carrier 202. The first end 320a of the thermal plate 308 is positioned between protruding members 212 of the carrier 202 and members 210 of the carrier 202 (908). The thermal plate 308 is rotated at the first end 204a of the carrier 202 such that the second end 320b of the thermal plate 308 is adjunct the landing 214 of the carrier 202 (910). The thermal plate 308 is coupled to the carrier 202 at the landing 214 using the fastener 452.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A thermal module assembly, comprising:
   a computing expansion card,
   a thermal interface material (TIM) positioned on a surface of the computing expansion card;
   a thermal plate; and
   a carrier configured to hold the computing expansion card with the TIM positioned on the surface of the computing expansion card, the carrier including:
      a first end positioned opposite to a second end,
      a first side positioned opposite to a second side,
      a support bar structure positioned between the first side and the second side at the first end of the carrier, the support bar including:
         a first protruding member protruding towards the second end of the carrier, and
         a second protruding member protruding towards the second end of the carrier,
      wherein the thermal plate is removably coupled to the carrier at the first end and the second end to provide a uniform pressure between the thermal plate, the TIM material, and the computing expansion card.

2. The thermal module assembly of claim 1, wherein the first side includes a first member extending between the first end and the second end of the carrier, and the second side includes a second member extending between the first end and the second end of the carrier.

3. The thermal module assembly of claim 2, wherein the first protruding member and the second protruding member protrude over the first member and the second member, respectively.

4. The thermal module assembly of claim 3, wherein a first end of the thermal plate, when coupled to the carrier, is positioned between the first protruding member and the first member, and between the second protruding member and the second member.

5. The thermal module assembly of claim 4, wherein the carrier further includes a landing at the second end of the carrier, wherein a second end of the thermal plate, opposite to the first end of the thermal plate, is removably coupled to the landing by a fastener.

6. The thermal module assembly of claim 1, wherein the first side includes a first platform and the second side includes a second platform, the first and the second platforms holding the computing expansion card.

7. The thermal module assembly of claim 6, wherein the second end of the carrier includes a third platform connected between the first and the second platforms, the third platform holding the computing expansion card.

8. The thermal module assembly of claim 1, wherein the first end of the carrier further includes an opening positioned between the first side and the second side.

9. An information handling system, including:
a computing apparatus, including a printed circuit board having a computing expansion card port;
a thermal module assembly, comprising:
a computing expansion card,
a thermal interface material (TIM) positioned on a surface of the computing expansion card;
a thermal plate; and
a carrier configured to hold the computing expansion card with the TIM positioned on the surface of the computing expansion card, the carrier including:
a first end positioned opposite to a second end,
a first side positioned opposite to a second side,
a support bar structure positioned between the first side and the second side at the first end of the carrier, the support bar including:
a first protruding member protruding towards the second end of the carrier, and
a second protruding member protruding towards the second end of the carrier,
wherein the thermal plate is removably coupled to the carrier at the first end and the second end to provide a uniform pressure between the thermal plate, the TIM material, and the computing expansion card,
wherein the thermal module assembly is coupled to the computing expansion card port.

10. The information handling system of claim 9, wherein the first side includes a first member extending between the first end and the second end of the carrier, and the second side includes a second member extending between the first end and the second end of the carrier.

11. The information handling system of claim 10, wherein the first protruding member and the second protruding member protrude over the first member and the second member, respectively.

12. The information handling system of claim 11, wherein a first end of the thermal plate, when coupled to the carrier, is positioned between the first protruding member and the first member, and between the second protruding member and the second member.

13. The information handling system of claim 12, wherein the carrier further includes a landing at the second end of the carrier, wherein a second end of the thermal plate, opposite to the first end of the thermal plate, is removably coupled to the landing by a fastener.

14. The information handling system of claim 9, wherein the first side includes a first platform and the second side includes a second platform, the first and the second platforms holding the computing expansion card.

15. The information handling system of claim 14, wherein the second end of the carrier includes a third platform connected between the first and the second platforms, the third platform holding the computing expansion card.

16. The information handling system of claim 9, wherein the first end of the carrier further includes an opening positioned between the first side and the second side.

* * * * *